(12) United States Patent
Senoo et al.

(10) Patent No.: US 10,641,825 B2
(45) Date of Patent: May 5, 2020

(54) SEMICONDUCTOR STORAGE DEVICE, OPERATING METHOD THEREOF AND ANALYSIS SYSTEM

(71) Applicant: Winbond Electronics Corp., Taichung (TW)

(72) Inventors: Makoto Senoo, Kanagawa (JP); Katsutoshi Suito, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/153,844

(22) Filed: Oct. 8, 2018

(65) Prior Publication Data

US 2019/0227123 A1    Jul. 25, 2019

(30) Foreign Application Priority Data

Jan. 24, 2018  (JP) ................... 2018-009925

(51) Int. Cl.
*G11C 7/00* (2006.01)
*G01R 31/3183* (2006.01)
(Continued)

(52) U.S. Cl.
CPC ..... *G01R 31/31835* (2013.01); *G01R 31/303* (2013.01); *G06T 7/0006* (2013.01);
(Continued)

(58) Field of Classification Search
CPC ........... G11C 8/08; G11C 16/16; G11C 16/26; G11C 29/44; G01R 31/31835; G01R 31/303; G06T 7/0006
(Continued)

(56) References Cited

U.S. PATENT DOCUMENTS 4,253,148 A * 2/1981 Johnson ............... G05B 19/052
                                                      700/4
4,864,598 A * 9/1989 Lynch ..................... H04M 11/04
                                                      379/22.02
(Continued)

FOREIGN PATENT DOCUMENTS

CN        103364713        4/2016
CN        104272390        9/2017
(Continued)

OTHER PUBLICATIONS

"Office Action of Taiwan Counterpart Application," dated May 30, 2019, p. 1-p. 5.

*Primary Examiner* — Viet Q Nguyen
(74) *Attorney, Agent, or Firm* — JCIPRNET

(57) ABSTRACT

A semiconductor storage device, an operating method thereof, and an analysis system capable of analyzing a defect during a specific operation is provided. A semiconductor chip provided by the disclosure determines that whether the semiconductor storage device is in a power-on mode based on a voltage supplied to an external terminal and executes a power-on sequence when the semiconductor storage device is in the power-on mode. The semiconductor chip then determines that whether execution of a break sequence is set, and if the execution is set, the semiconductor chip executes the break sequence. In the break sequence, a selected operation is executed, so that an operation being executed is stopped at a selected timing. A defect of the semiconductor chip is analyzed in a stopped state.

17 Claims, 4 Drawing Sheets

(51) Int. Cl.
| | |
|---|---|
| *G06T 7/00* | (2017.01) |
| *G11C 29/44* | (2006.01) |
| *G01R 31/303* | (2006.01) |
| *G11C 16/26* | (2006.01) |
| *G11C 29/12* | (2006.01) |
| *G11C 16/16* | (2006.01) |
| *G11C 8/08* | (2006.01) |
| *G11C 29/02* | (2006.01) |
| *G11C 16/22* | (2006.01) |
| *G11C 29/56* | (2006.01) |
| G11C 29/04 | (2006.01) |
| G11C 29/50 | (2006.01) |
| G11C 16/20 | (2006.01) |

(52) U.S. Cl.
CPC ............... *G11C 8/08* (2013.01); *G11C 16/16* (2013.01); *G11C 16/225* (2013.01); *G11C 16/26* (2013.01); *G11C 29/025* (2013.01); *G11C 29/12005* (2013.01); *G11C 29/44* (2013.01); *G11C 29/56* (2013.01); *G06T 7/001* (2013.01); *G06T 2207/30148* (2013.01); *G11C 16/20* (2013.01); *G11C 2029/0403* (2013.01); *G11C 2029/0407* (2013.01); *G11C 2029/1202* (2013.01); *G11C 2029/1204* (2013.01); *G11C 2029/5006* (2013.01)

(58) Field of Classification Search
USPC ........................................................ 365/201
See application file for complete search history.

(56) References Cited

U.S. PATENT DOCUMENTS

| | | | | |
|---|---|---|---|---|
| 5,105,387 | A * | 4/1992 | Childers | .................. G11C 8/16 365/149 |
| 5,566,303 | A * | 10/1996 | Tashiro | ............ G01R 31/31701 377/39 |
| 5,995,731 | A * | 11/1999 | Crouch | .................. G11C 29/26 714/718 |
| 6,845,480 | B2 * | 1/2005 | Wang | ............... G01R 31/31835 703/22 |
| 7,336,088 | B2 * | 2/2008 | Rius Vazquez | .... G01R 31/3004 324/750.3 |
| 7,500,148 | B2 * | 3/2009 | Murata | ............ G01R 31/31924 714/32 |
| 7,647,562 | B2 | 1/2010 | Ghercioiu et al. | |
| 8,793,536 | B2 * | 7/2014 | Tran | .................... G01R 31/3171 714/34 |
| 9,158,873 | B1 | 10/2015 | Chong et al. | |
| 2002/0083369 | A1 * | 6/2002 | Schelling | ............ G06F 11/2284 714/36 |
| 2002/0147882 | A1 | 10/2002 | Pua et al. | |
| 2004/0066695 | A1 * | 4/2004 | Anand | ................. G11C 29/027 365/225.7 |
| 2006/0075395 | A1 * | 4/2006 | Lee | ...................... G11C 16/102 717/168 |
| 2008/0022176 | A1 * | 1/2008 | Anzou | ................... G11C 29/16 714/733 |
| 2008/0091988 | A1 * | 4/2008 | Yoel | ....................... G11C 29/24 714/711 |
| 2011/0128787 | A1 * | 6/2011 | Shelton | .................. G11C 29/12 365/185.08 |
| 2013/0124888 | A1 * | 5/2013 | Tanaka | ................... G11C 16/06 713/320 |

FOREIGN PATENT DOCUMENTS

| | | |
|---|---|---|
| JP | 2010135030 | 6/2010 |
| TW | I262572 | 9/2006 |
| TW | 201802813 | 1/2018 |

* cited by examiner

SEMICONDUCTOR STORAGE DEVICE, OPERATING METHOD THEREOF AND ANALYSIS SYSTEM

CROSS-REFERENCE TO RELATED APPLICATION

This application claims the priority benefit of Japan application serial no. 2018-009925, filed on Jan. 24, 2018. The entirety of the above-mentioned patent application is hereby incorporated by reference herein and made a part of this specification.

BACKGROUND

Technical Field

The disclosure relates to a semiconductor storage device such as a flash memory. More particularly, the disclosure relates to an analysis of a defect of a semiconductor storage device.

Description of Related Art

In a semiconductor device, a defect may exist in routing or circuits and the like owning to a defective manufacturing process. Through analyzing such defect and identifying the abnormal batches before the products are shipped, productivity can thereby be increased. For instance, in a defective product analysis method of a semiconductor memory according to Japanese Patent Publication No. 2010-135030, a defect address of a storage array may be determined through a test circuit, a defect mode may be determined through analyzing the defect address, and the determined defect mode is output to the outside.

In certain types of analysis devices such as an emission microscope (EMMI) or an optical beam induced resistance change (OBIRCH), a camera is included to capture the entire semiconductor chip. The position of the abnormal leakage current on the semiconductor chip can be detected through analyzing the captured image data, and the position where the abnormal current is detected on the image data can be enabled to emit light.

An analysis device of one of these types includes a terminal configured for a Vcc power supply, an external terminal configured for chip selection, and a terminal configured for GND. The terminals can individually be electrically connected to corresponding external terminals of the semiconductor chip, and in this way, the semiconductor chip is in the standby state, and the leakage current can be detected at this time.

Nevertheless, recently, the leakage current generated by a specific operation of a semiconductor memory is also required to be detected. For instance, a short circuit caused among the bit lines when pre-charging is performed to the global bit lines by the flash memory in a reading operation, a short circuit caused among the word lines when a programming pulse is applied in a programming operation, and the leakage caused when an erasing voltage is applied to a well in an erasing operation etc. are required to be detected.

Nevertheless, in an existing analysis device, a terminal configured to output a command to the semiconductor chip is not included (i.e., an interface configured to control the semiconductor chip is not included), the abnormal leakage current caused by a specific operation performed by the semiconductor memory thus cannot be detected.

SUMMARY

The disclosure provides a semiconductor storage device, an operating method of the semiconductor storage device, and a defect analysis system capable of analyzing a defect caused by a specific operation to solve the foregoing problem.

An operating method provided by an embodiment of the disclosure is an operating method of a semiconductor storage device including a controller configured to control an operation related to a storage array. The controller determines that whether the semiconductor storage device is in a specific mode based on a signal supplied to an external terminal. The controller executes a break sequence to stop the operation in a process of executing the operation related to the storage array when determining that the semiconductor storage device is in a specific mode.

A semiconductor storage device provided by an embodiment of the disclosure includes a storage may, a controller configured to control an operation related to the storage array, and an external terminal. The controller includes a determination part and an execution part. The determination part determines that whether the semiconductor storage device is in a specific mode based on the signal supplied to the external terminal. The execution part executes a break sequence to stop the operation in a process of executing the operation related to the storage array when the determination part determines that the semiconductor storage device is in a specific mode.

An analysis system provided by an embodiment of the disclosure includes the semiconductor storage device and an analysis device connected to the semiconductor storage device. The analysis device supplies a power voltage to the semiconductor storage device and analyzes a portion in the semiconductor storage device where an abnormal current flows. In an embodiment of the disclosure, the analysis device includes a part to visualize the portion where the abnormal current flows.

To sum up, since the break sequence is executed in a specific mode, the analysis of the expected operation performed by the semiconductor storage device may be easily performed. In particular, when the interface configured to control the memory is absent between the analysis device and the semiconductor storage device (the semiconductor chip), the determination of whether the semiconductor storage device is in a specific mode can be made based on the signal supplied to the external terminal.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Embodiments of the disclosure are described hereinafter with reference to the drawings. In the disclosure, an NAND type flash memory is exemplified as a semiconductor storage device, but the disclosure is not limited thereto. The disclosure may also be applied to other semiconductor memories.

Figure 1A:
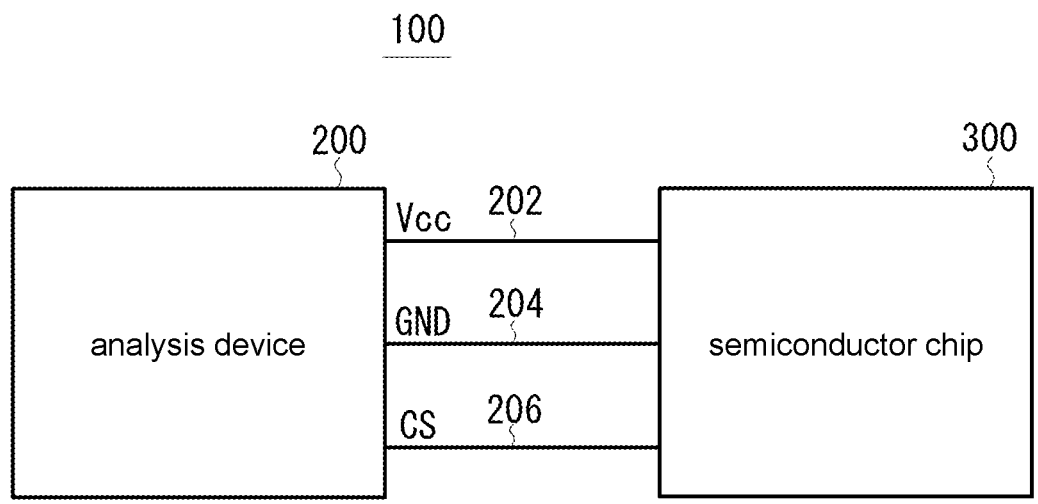
FIG. 1A and FIG. 1B are diagrams schematically describing an analysis system according to an embodiment of the disclosure.
Figure 1B:
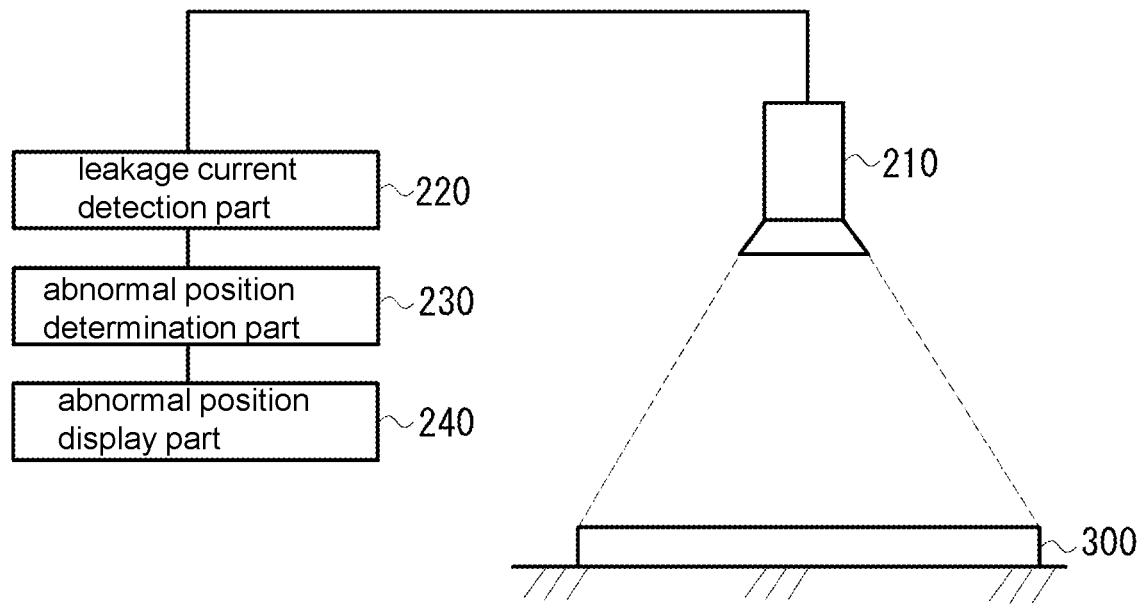

FIG. 1A and FIG. 1B are diagrams of an overall structure of an analysis system according to an embodiment of the disclosure. As shown in FIG. 1A and FIG. 1B, an analysis system 100 of this embodiment includes an analysis device 200 analyzing a defect or malfunction and a semiconductor chip 300 acting as an object to be analyzed. The analysis device 200 includes a terminal 202 configured for a Vcc power source, a terminal 204 configured for GND, and a terminal 206 configured for chip selection so as to be electrically connected to the semiconductor chip 300. The terminal 206 configured for chip selection is optional, and the terminal 206 is not connected when a chip selection terminal is not included in the semiconductor chip 300. After the semiconductor chip 300 is connected to the Vcc power source from the analysis device 200, a Vcc voltage is detected, a power-on sequence is executed, and the semiconductor chip 300 is in a standby state.

FIG. 1B is an example illustrating a structure of the analysis device 200. The analysis device 200 includes a capturing camera 210, a leakage current detection part 220, an abnormal position determination part 230, and an abnormal position display part 240. The capturing camera 210 captures an overall plane of the semiconductor chip 300 in the standby state. The leakage current detection part 220 analyzes image data captured by the capturing camera 210 to detect a leakage current on the semiconductor chip. The abnormal position determination part 230 compares the leakage current detected by the leakage current detection part 220 with a threshold value to identify a position where the leakage current flows. When displaying the image data captured by the capturing camera 210 on a display, the abnormal position display part 240 enables the position identified by the abnormal position determination part 230 to emit light. For instance, if a periphery of a pad of the semiconductor chip 300 is enabled to emit light, it may be expected that abnormal routing occurs in a vicinity of the pad. Further, the analysis device 200 may also deliver the following function of, that is, adjusting a detection electrical potential of the leakage current, the threshold value configured to determine that whether the leakage current is abnormal, magnification of the capturing camera, etc. according to user input.

Figure 2:
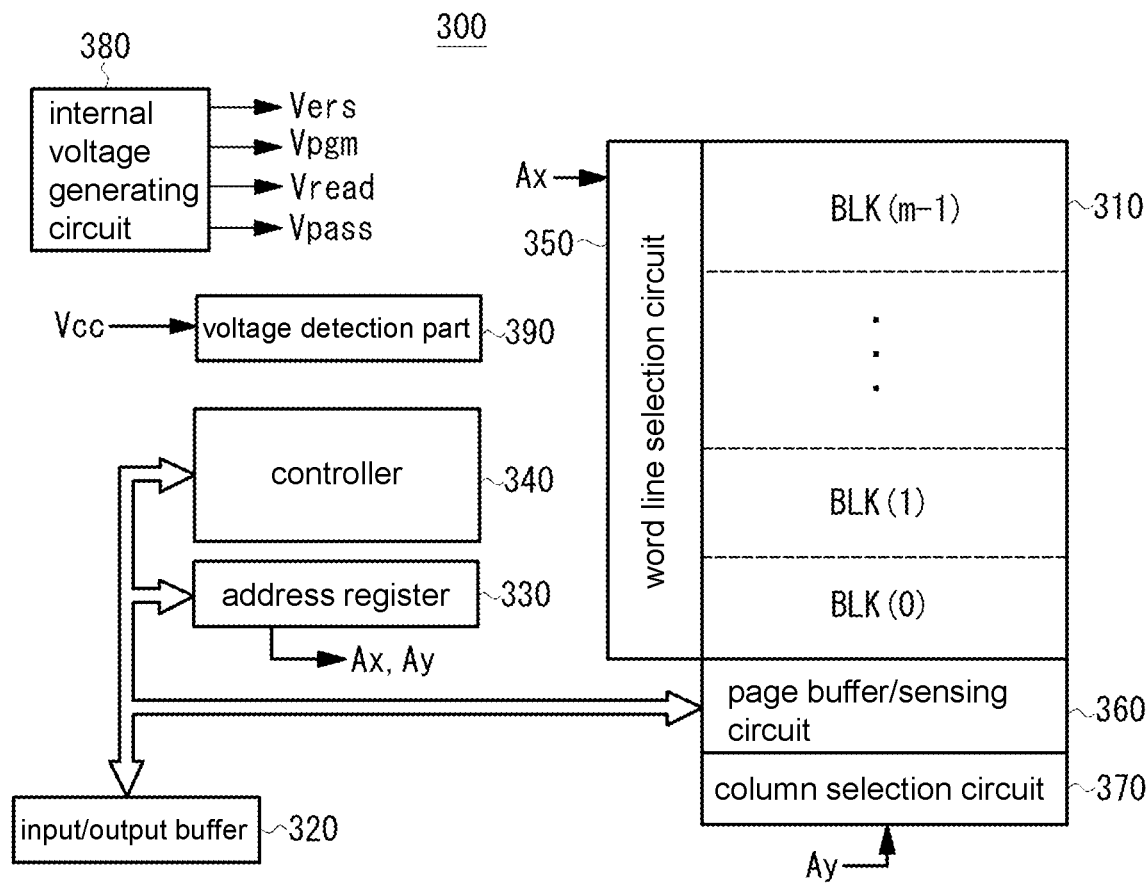
FIG. 2 is a diagram illustrating a structure of a flash memory according to an embodiment of the disclosure.

FIG. 2 is an internal structure illustrating a flash memory (semiconductor chip) 300. As shown in FIG. 2, the flash memory 300 includes a storage array 310, an input/output buffer 320, an address register 330, a controller 340, a word line selection circuit 350, a page buffer/sensing circuit 360, a column selection circuit 370, an internal voltage generating circuit 380, and a voltage detection part 390. A plurality of storage units are arranged in a matrix in the storage array 310. The input/output buffer 320 is connected to an external input/output terminal I/O. The address register 330 obtains address data from the input/output buffer 320. The controller 340 obtains command data and the like from the input/output buffer 320 to control each of the parts. The word line selection circuit 350 obtains row address information Ax from the address register 330, decodes the row address information Ax, and performs block selection or word line selection and the like according to a decoding result. The page buffer/sensing circuit 360 preserves data read from a page selected by the word line selection circuit 350 or preserves input data that should be programmed to a selected page. The column selection circuit 370 obtains column address information Ay from the address register 330, decodes the column address information Ay, and selects column address data in the page buffer/sensing circuit 360 according to a decoding result. The internal voltage generating circuit 380 generates various voltages required by data reading, programming, erasing, etc. (a write-in voltage Vpgm, a pass voltage Vpass, a reading voltage Vread, an erasing voltage Vers, etc.). The voltage detection part 390 monitors the power voltage Vcc supplied by the external terminal when the power source is connected and detects an electrical potential of a power-on voltage.

The storage array 310 includes m blocks, including a block BLK (0), a block BLK (1), . . . , and a block BLK (m−1), in a column direction. A plurality of NAND string units are formed in one block, and the NAND string units are formed by connecting the storage units in series. In addition, a fuse unit is included in the storage array 310, and the fuse unit stores setting information related to setting or setting of a user option configured to a voltage of an operation of the flash memory. The fuse unit is a region that cannot be accessed by a user.

Figure 3:
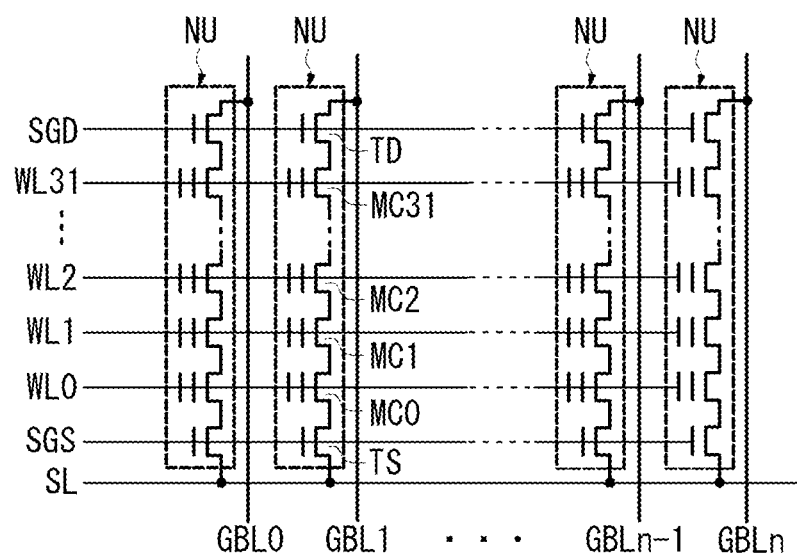
FIG. 3 is a diagram illustrating a structure of NAND string units of a storage array.

FIG. 3 is a diagram illustrating the NAND string units NU. The NAND string units NU include a plurality of storage units MCi (i=0, 1, . . . , and 31) connected in series, a selection transistor TD connected to a drain side of the storage unit MC31, and a selection transistor TS connected to a source side of the storage unit MC0. A drain of the selection transistor TD is connected to a corresponding bit line GBL, and a source of the selection transistor TS is connected to a shared source line SL.

Each of the storage units typically includes a metal oxide semiconductor (MOS) structure. The MOS structure includes a source/drain as an N type diffusion region formed in a P well, a tunnel oxide film formed on a channel between the source/drain, a floating gate (charge storage layer) formed on the tunnel oxide film, and a control gate formed on the floating gate via a dielectric film. The storage unit may be a single level cell (SLC) type storing 1 bit (binary data) or may be a multi level cell (MLC) type storing plural bits.

A control gate of the storage unit MCi is connected to a word line WLi, and a gate of the selection transistor TD and a gate of the selection transistor TS are connected to a selection gate line SGD and a selection gate line SGS. The word line selection circuit 350 selectively drives the selection transistors TD and TS through the selection gate lines SGS and SGD according to the row address information Ax and selectively drives word lines WL0 to WL31.

In a reading operation, a positive voltage is applied to bit lines; a voltage (e.g., 0 V) is applied to a selected word line, the pass voltage Vpass (e.g., 4.5 V) is applied to a non-selected word line; a positive voltage (e.g., 4.5 V) is applied to the selection gate lines SGD and SGS, the selection transistors TD and TS are connected, and 0 V is applied to a shared source line. In a programming (writing) operation, a programming voltage Vpgm with a high voltage (15 V to 20 V) is applied to the selected word line; an intermediate potential (e.g., 10 V) is applied to the non-selected word line to turn on the selection transistor TD, turn off the selection transistor TS, and supply a potential corresponding to data of "0" or "1" to the bit line GBL. In an erasing operation, 0 V is applied to the selected word line in the block, and a high voltage (e.g., 20 V) is applied to the P-well to extract electrons of the floating gate to a substrate, so as to erase data using block as a unit.

The voltage detection part 390 monitors a voltage electrical potential of the power voltage Vcc supplied to the flash memory 300 when the power source is connected and outputs a power-on detection signal to the controller 340 when the supplied voltage electrical potential reaches a power-on voltage electrical potential. A power-on mode is determined based on the power-on detection signal, and the controller 340 executes the power-on sequence when the power-on mode is determined.

Figure 4:
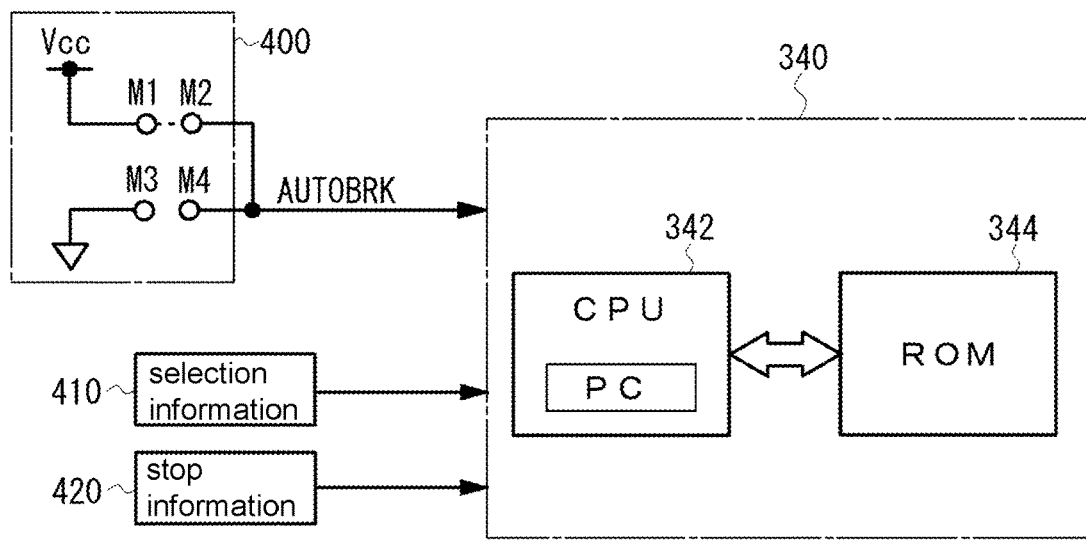
FIG. 4 is a diagram illustrating a structure of a break sequence configured to execute an embodiment of the disclosure.

As shown in FIG. 4, the controller 340 includes a central processing unit (CPU) 342 or a read only memory (ROM) 344, etc. A command code configured to control various programs such as the power-on sequence, the break sequence, the reading operation, the programming operation, the erasing operation, etc. are stored in the ROM 344. According to an address set in a program counter (PC), the CPU 342 reads the command code from the ROM 344, decodes the read command code, and controls operations of the word line selection circuit 350, the page buffer/sensing circuit 360, the internal voltage generating circuit 380, etc. according to a command obtained after decoding.

The controller 340 determines that whether the power-on mode is provided according to the power-on detection signal from the voltage detection part 390 and executes the power-on sequence if the power-on mode is determined to be provided. A reading operation on the fuse unit of the storage array 310 is included in one power-on sequence. Setting information such as a voltage or the user option and the like is stored in the fuse unit, and the setting information read from the fuse unit is loaded to a configuration register etc.

A setting part 400 may be included in this embodiment, and the setting part 400 is configured to set whether to sequentially execute the break sequence when the power-on mode is being switched to. The break sequence provides the function of selecting and storing array-related operations after the power-on sequence and executing the selected operation so that the operation currently being executed stops at a selected timing.

The setting part 400, for example, includes a metal option. If a terminal M1/terminal M2 is opened and a terminal M3/terminal M4 is short circuited, an AUTOBRK signal is at a GND (L) electrical potential. On the contrary, if the terminal M1/terminal M2 is short circuited, and the terminal M3/terminal M4 is turned off, the AUTOBRK signal is at a Vcc (H) electrical potential. In an embodiment, in transition to the power-on mode, the AUTOBRK signal may be set to be at the H electrical potential (the Vcc electrical potential) when the break sequence is executed. That is, the break sequence is enabled when the AUTOBRK signal is at the H electrical potential, and the break sequence is disabled when the AUTOBRK signal is at the L electrical potential, which also means that the AUTOBRK signal of a setting state of the break sequence is provided to the controller 340.

The setting part 400 does not belong to the metal option. In other embodiments, the setting part 400 may also stores the enabled/disabled setting information of the AUTOBRK signal to the fuse unit, loads the setting information to a register when the power-on sequence is executed, and generates the AUTOBRK signal.

In addition, in order to execute the break sequence, selection information 410 configured to select an operation related to the storage array and stop information 420 configured to stop the selected operation to stop at a selected timing are set in advance in this embodiment. Moreover, the set selection information 410 and the stop information 420 are provided to the controller 340.

In an embodiment, the selection information 410 and the stop information 420 are stored in the fuse unit of the storage array 310. When the power-on sequence is executed, the selection information 410 and the stop information 420 are read from the fuse unit and are provided to the controller 340. In addition, in other embodiments, the selection information 410 and the stop information 420 may be stored in a storage region of a non-volatile register and the like in advance, and the selection information 410 and the stop information 420 may be read from the storage region and provided to the controller 340.

The selection information 410 is configured to select information of an operation executed in the break sequence, and to be specific, to select information of the reading operation, the programming operation, and the erasing operation. In an embodiment, the selection information 410, for example, includes 2-bit data. [01] represents the reading operation, [10] represents the programming operation, [11] represents the erasing operation, and [00] represents a no selection operation.

When the selected operation is executed according to the selection information 410, the stop information 420 includes a timing which is determined to stop the operation. To be specific, address information of the ROM 344 is included. A program such as a command code configured to control the operation related to the storage array is stored in the ROM 344. The CPU 342 reads the command code and the like according to the address set in the program counter PC from the ROM 344, decodes the read command code, and controls each of the parts according to a decoding result. After a command code of an address is read from the ROM 344, 1 is simultaneously added to or subtracted from the address of the program counter and a next clock signal, and a command code of a next address is continuously read from the ROM 344. When the address of the program counter PC is identical to the address included in the stop information 420, the controller 340 stops the program counter PC, that is, stops reading the command code of the next address. In this way, the operation being executed is practically stopped or suspended.

For instance, in the reading operation, when the operation is stopped at the timing of pre-charging the bit lines, an address of a command code controlling pre-charging of the bit lines may be set in the stop information 420. Specifically, the CPU 342 sequentially reads the command codes for reading the operations from the ROM 344 and stops updating the program counter when the address of the stop information is identical to the address of the program counter so that the next command is not executed. Actually, the CPU 342 continues to execute the command for controlling pre-charging of the bit lines, but the reading operation stops at a pre-charging phase of the bit lines. In an embodiment, the CPU 342 may count stop time through a timer and analyzes the flash memory in the stopped state during this period. Afterwards, when counting performed by the timer reaches a specific point, update of the program counter PC is re-started, and the CPU 342 reads the command code of the next address, executes the remaining reading operation, and ends the break sequence.

Figure 5:
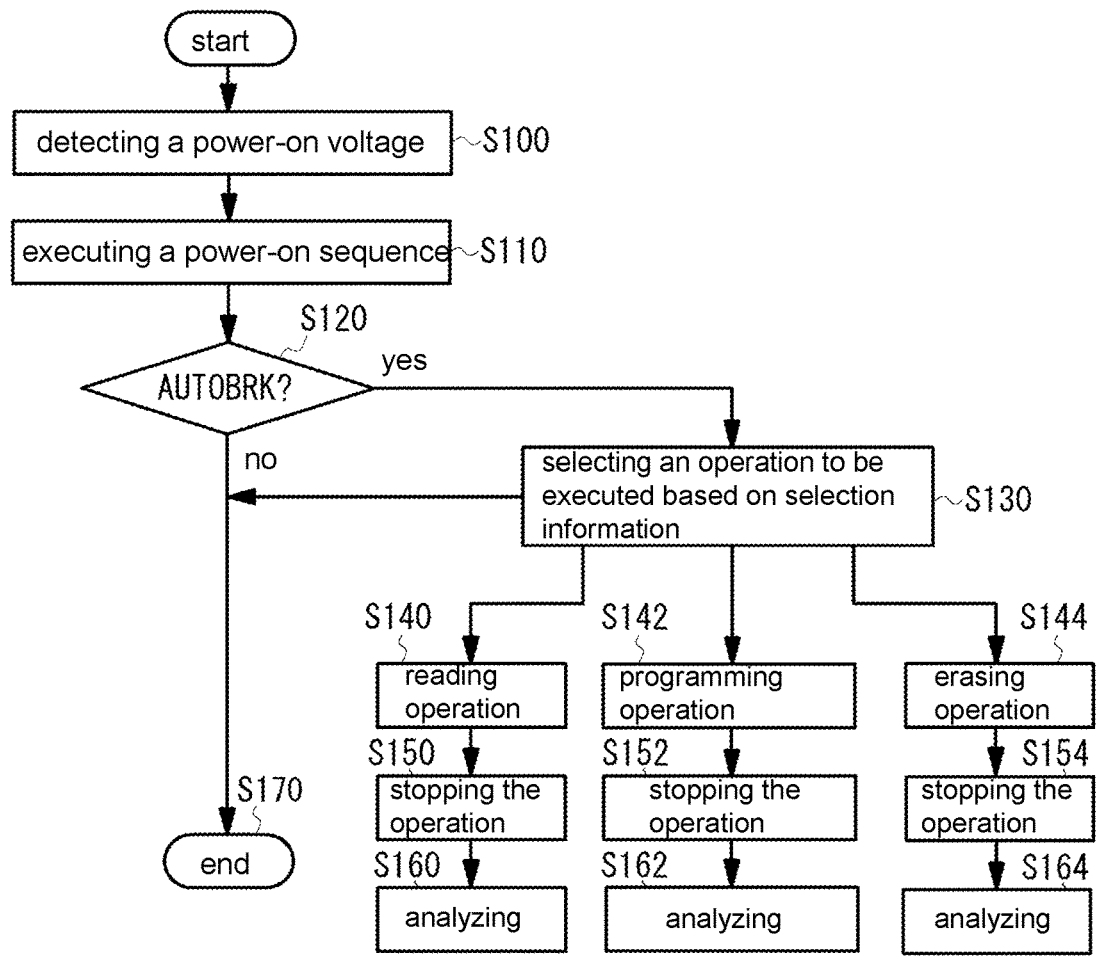
FIG. 5 is a flowchart of operations of the break sequence according to an embodiment of the disclosure.

Next, operations of the flash memory when power is on are described in this embodiment with reference to a flowchart of FIG. 5. The power voltage is supplied to the external terminal configured for the Vcc power source of the flash memory (semiconductor chip) 300 from the analysis device 200, and the voltage is detected by the voltage detection part 390 (S100). The controller 340 determines that whether the power-on mode is provided according to a detection result from the voltage detection part 390 and executes the power-on sequence if the power-on mode is determined to be provided (S110). In the power-on sequence, for example, the setting information read from the fuse unit of the storage array 310 is loaded to the configuration register. In addition, when the selection information 410 and the stop information 420 are stored in the fuse unit, the selection information 410 and the stop information 420 are also read and provided to the controller 340.

When the power-on sequence is over, the controller 340 determines that whether execution of the break sequence is set with reference to the AUTOBRK signal (S120). For instance, if the AUTOBRK signal is at the L electrical potential, the controller 340 determines that the execution of the break sequence is not set and ends the entire power-on sequence, and the flash memory chip is in the standby state. From another perspective, if the AUTOBRK signal is at the H electrical potential, the controller 340 determines that the execution of the break sequence is set, and the controller 340 selects the operation to be executed based on the selection information 410 (S130) in such a condition. The reading operation is selected if the selection information 410 is [01] (S140), the programming operation is selected if the selection information 410 is [10] (S142), the erasing operation is selected if the selection information 410 is [11] (S144), and no operation is selected and therefore ending the process if the selection information 410 is [00] (S170).

The controller 340 executes the selected operation (the reading operation, the programming operation, and the erasing operation) (S140, S142, and S144) and stops the operation being executed according to the stop information 420 (S150, S152, and S154). The timing to stop may be set according to an operation state to be analyzed through the analysis device 200, such as a state of pre-charging global bit lines in the reading operation, a state of applying a programming pulse to the selected word line in the programming operation, a state of applying an erasing voltage to a well in the erasing operation, etc.

Figure 6:
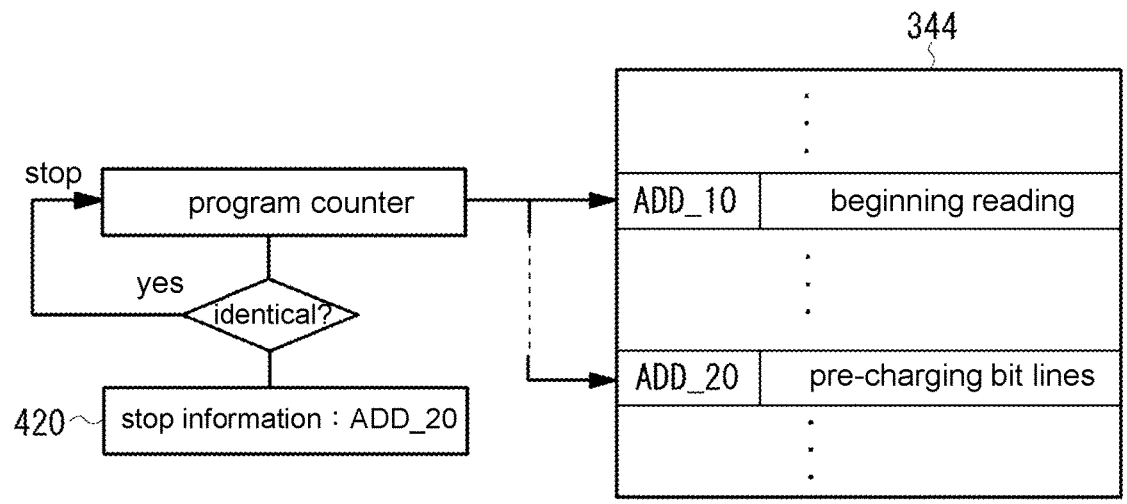
FIG. 6 is a diagram illustrating stopping of a reading operation in a state of pre-charging bit lines according to an embodiment of the disclosure.

FIG. 6 is an example illustrating stopping in a state of pre-charging global bit lines. When the reading operation is executed, an up-front address ADD_10 enabling the reading operation of the ROM 344 to begin is set in the program counter. The CPU 342 reads the command code configured to enable the reading operation to begin from the ROM 344 according to the address ADD_10 of the program counter. Herein, data and the like configured to read a predetermined page (a row address) of the storage array 310 is stored in the ROM 344. After a command code of the ADD_10 is read from the ROM 344 and the address of the program counter and the clock signal are simultaneously added to ADD_11, a next command code is then read from the ROM 344. Afterwards, the command codes are sequentially read from the ROM 344 through the same manner, so as to control the reading operation.

When the command code of pre-charging the bit lines is stored in an address ADD_20 of the ROM 344, the address ADD_20 may be set in the stop information 420. After the address of the program counter is added to the ADD_20, the CPU 342 reads the command code configured to pre-charge the bit lines from the ROM 344, and accordingly, the page buffer/sensing circuit 360 pre-charges the global bit lines. At this time, since the address of the program counter and the address ADD_20 of the stop information 420 are identical, the address of the program counter stops being added. Accordingly, the reading operation stops in the state of pre-charging the global bit lines.

With reference to FIG. 5 again, when the selected operation stops, the analysis device 200 analyzes whether abnormality occurs in the flash memory chip (S160, S162, and S164). In this example, for instance, the reading operation stops when the bit lines are pre-charged, and whether an abnormal leakage current is generated among the global bit lines is analyzed.

Figure 7:
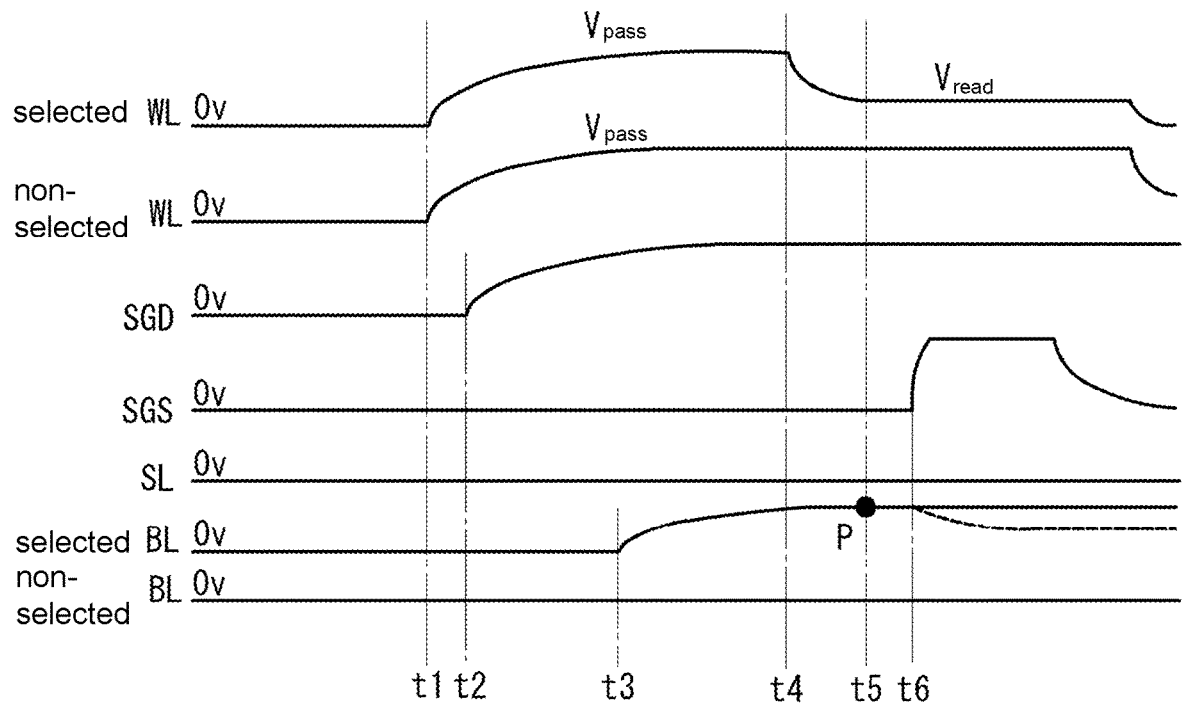
FIG. 7 is a timing chart of analyzing whether a defect is presented among the bit lines when the bit lines are pre-charged in the reading operation according to an embodiment of the disclosure.

FIG. 7 is a timing chart illustrating stopping of the reading operation at the timing of pre-charging the bit lines when the break sequence is executed. At time t1, the pass voltage Vpass is applied to the selected word line and the non-selected word line. The pass voltage Vpass is a voltage enabling the storage unit to be connected regardless of the storage unit being in an erasing state or in a programming state. At time t2, a bit line side selection transistor of the NAND string is connected, and the NAND is connected to the global bit lines. At time t3, a pre-charging voltage is applied to the selected bit line. At time t4, a voltage of the selected word line is changed to the reading voltage Vread. Time t5 is a timing for performing an analysis when the reading operation stops, so as to analyze whether a short circuit presented by P is generated among the bit lines. The analysis device 200 detects a leakage current in the state when the pre-charging operation stops at the time t5, identifies a position of which the abnormal leakage current occurs, enables the identified position on the captured image data to emit light, and displays the position.

After the analysis is completed, the remaining reading operation is re-started. Time t6 is a timing when a source line side selection transistor is connected and the selected bit line is connected to the shared source line. At a time point when the reading operation is over, the break sequence ends, and the flash memory 300 is in the standby state.

In view of the foregoing, in the embodiments of the disclosure, the break sequence is executed in the power-on sequence. Hence, even though the analysis device 200 does not include the interface configured to control the flash memory 300, the analysis device 200 may still be able to analyze the defect or malfunction of the flash memory 300 in the expected operation state.

The disclosure may also be applied to the semiconductor memories in addition to the NAND-type flash memory which is exemplified in the embodiments. In addition, the examples of determining the power-on state based on the voltage signal of the external terminal configured for the Vcc power source and following execution of the break sequence are presented in the embodiments. Nevertheless, in addition to that, in the embodiments of the disclosure, even if a specific signal is applied to the external terminal so the semiconductor storage device performs an operation in a specific mode, the break sequence can still be sequentially executed.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An operating method of a semiconductor storage device, the semiconductor storage device comprising a controller configured to control an operation related to a storage array, wherein
   the controller determines that whether the semiconductor storage device is in a specific mode based on a signal supplied to an external terminal, and
   the controller executes a break sequence to stop the operation in a process of executing the operation related to the storage array when determining that the semiconductor storage device is in a specific mode, then detects a leakage current of the semiconductor storage device to execute a defect analysis.

2. The operating method as claimed in claim 1, wherein the break sequence comprises the following steps:
   selecting the operation related to the storage array;
   executing the selected operation; and
   stopping the selected operation at a selected timing.

3. The operating method as claimed in claim 2, wherein the break sequence comprises the following steps:
   reading selection information configured to select the operation related to the storage array and stop information configured to stop the selected operation at the selected timing from a predetermined storage region.

4. The operating method as claimed in claim 1, wherein the controller executes the break sequence when the semiconductor storage device is determined to be in a power-on mode based on a power voltage supplied to the external terminal.

5. The operating method as claimed in claim 2, wherein the controller executes the break sequence when the semiconductor storage device is determined to be in a power-on mode based on a power voltage supplied to the external terminal.

6. The operating method as claimed in claim 1, wherein the operating method further comprises the following steps:
   determining whether to execute the break sequence,
   executing the break sequence by the controller when execution of the break sequence is determined.

7. The operating method as claimed in claim 2, wherein the operating method further comprises the following steps:
   determining whether to execute the break sequence,
   executing the break sequence by the controller when execution of the break sequence is determined.

8. The operating method as claimed in claim 3, wherein the controller stops reading a code from a read only memory and stops the selected operation based on an address contained in the stop information.

9. The operating method as claimed in claim 3, wherein the controller stops the selected operation when bit lines are pre-charging in a reading operation of the storage array.

10. A semiconductor storage device, comprising:
    a storage array;
    a controller, configured to control an operation related to the storage array; and
    an external terminal,
    the controller comprising
    a determination part, determining that whether the semiconductor storage device is in a specific mode based on a signal supplied to the external terminal; and
    an execution part, executing a break sequence to stop the operation in a process of executing the operation related to the storage array when the determination part determines that the semiconductor storage device is in a specific mode, then detecting a leakage current of the semiconductor storage device to execute a defect analysis.

11. The semiconductor storage device as claimed in claim 10, wherein
    the determination part determines that whether the semiconductor storage device is in a power-on mode based on a voltage supplied to the external terminal, and the execution part executes the break sequence when the semiconductor storage device is determined to be in the power-on mode.

12. The semiconductor storage device as claimed in claim 10, wherein
    the execution part reads selection information configured to select the operation related to the storage array and stop information configured to stop the selected operation at a selected timing from a predetermined storage region, and the execution part selects the operation according to the selection information and stops the selected operation according to the stop information.

13. The semiconductor storage device as claimed in claim 11, wherein
    the execution part reads selection information configured to select the operation related to the storage array and stop information configured to stop the selected operation at a selected timing from a predetermined storage region, and the execution part selects the operation according to the selection information and stops the selected operation according to the stop information.

14. The semiconductor storage device as claimed in claim 10, wherein
    the semiconductor storage device further comprises a setting part configured to determine whether to execute the break sequence, and
    the execution part executes the break sequence when the setting part determines execution of the break sequence.

15. The semiconductor storage device as claimed in claim 12, wherein:
    the execution part stops reading a code from a read only memory and stops the selected operation based on an address contained in the stop information.

16. An analysis system comprising the semiconductor storage device as claimed in claim 10 and an analysis device connected to the semiconductor storage device, wherein
    the analysis device supplies a power voltage to the semiconductor storage device and analyzes a portion in the semiconductor storage device where an abnormal current flows.

17. The analysis system as claimed in claim 16, wherein the analysis device comprises a part to visualize the portion where the abnormal current flows.

* * * * *